(12) United States Patent
Ratcliffe

(10) Patent No.: US 7,332,861 B2
(45) Date of Patent: Feb. 19, 2008

(54) LIGHT-EMITTING STRUCTURES

(75) Inventor: William R. Ratcliffe, Thousand Oaks, CA (US)

(73) Assignee: Agilight, Inc., San Angelo, TX (US)

( * ) Notice: Subject to any disclaimer, the term of this patent is extended or adjusted under 35 U.S.C. 154(b) by 439 days.

(21) Appl. No.: 10/773,352

(22) Filed: Feb. 5, 2004

(65) Prior Publication Data

US 2005/0174049 A1    Aug. 11, 2005

(51) Int. Cl.
*H01J 1/62* (2006.01)
*H01J 63/04* (2006.01)

(52) U.S. Cl. .................. 313/506; 257/99; 362/800

(58) Field of Classification Search .......... 313/506; 257/99; 362/800
See application file for complete search history.

(56) References Cited

U.S. PATENT DOCUMENTS

| 3,860,847 | A | * | 1/1975 | Carley ................. 313/110 |
| 3,887,803 | A | | 6/1975 | Savage, Jr. ............ 240/151 |
| 4,358,708 | A | | 11/1982 | Silva et al. ............ 315/58 |
| 4,830,976 | A | | 5/1989 | Morris et al. .......... 437/47 |
| 5,914,501 | A | | 6/1999 | Antle et al. ........... 257/99 |
| 5,970,318 | A | | 10/1999 | Choi et al. ............ 438/99 |
| 6,150,668 | A | | 11/2000 | Bao et al. ............. 257/40 |
| 6,356,031 | B1 | | 3/2002 | Thagard et al. ........ 315/169.3 |
| 6,428,189 | B1 | | 8/2002 | Hochstein ............. 362/373 |
| 6,621,716 | B2 | | 9/2003 | Edwards et al. ........ 361/803 |

FOREIGN PATENT DOCUMENTS

| CN | 1437773 | 8/2003 |
| JP | 6432671 | 2/1989 |
| JP | 2283070 | 11/1990 |
| JP | 11251641 | 9/1999 |
| JP | 2000101150 | 4/2000 |
| WO | WO0199207 | 12/2001 |
| WO | WO2006134410 A3 | 12/2006 |

OTHER PUBLICATIONS

PCT International Preliminary Report on Patentability (PCT/IB/373); Written Opinion of the International Searching Authority (PCT/ISA/237)).

* cited by examiner

*Primary Examiner*—Nimeshkumar D. Patel
*Assistant Examiner*—Anthony Perry
(74) *Attorney, Agent, or Firm*—Koppel, Patrick, Heybl & Dawson

(57) ABSTRACT

Light-emitting structures of reduced size are realized with combinations of light-emitting diodes, resistive and conductive films, and interconnect members. Other embodiments are provided which simplify fabrication and assembly.

10 Claims, 4 Drawing Sheets

LIGHT-EMITTING STRUCTURES

BACKGROUND OF THE INVENTION

1. Field of the Invention

The present invention relates generally to light-emitting diodes.

2. Description of the Related Art

Various light-emitting structures have been proposed in response to the advantageous features of light-emitting diodes (e.g., low voltage, low heating, low maintenance, color diversity and long life). These structures, however, are generally complex and large because they include a number of elements (e.g., body, lens and large, discrete resistors) so that they are not suitable for a variety of lighting applications that require small, inexpensive light structures.

BRIEF SUMMARY OF THE INVENTION

The present invention is directed to light-emitting structures that facilitate size and cost reduction and simplified fabrication and assembly.

The novel features of the invention are set forth with particularity in the appended claims. The invention will be best understood from the following description when read in conjunction with the accompanying drawings.

DETAILED DESCRIPTION OF THE INVENTION

FIGS. 1-4 illustrate embodiments of light-emitting structures whose features provide a number of advantages which include reduced size and cost and simplified fabrication and assembly.

Figure 1:
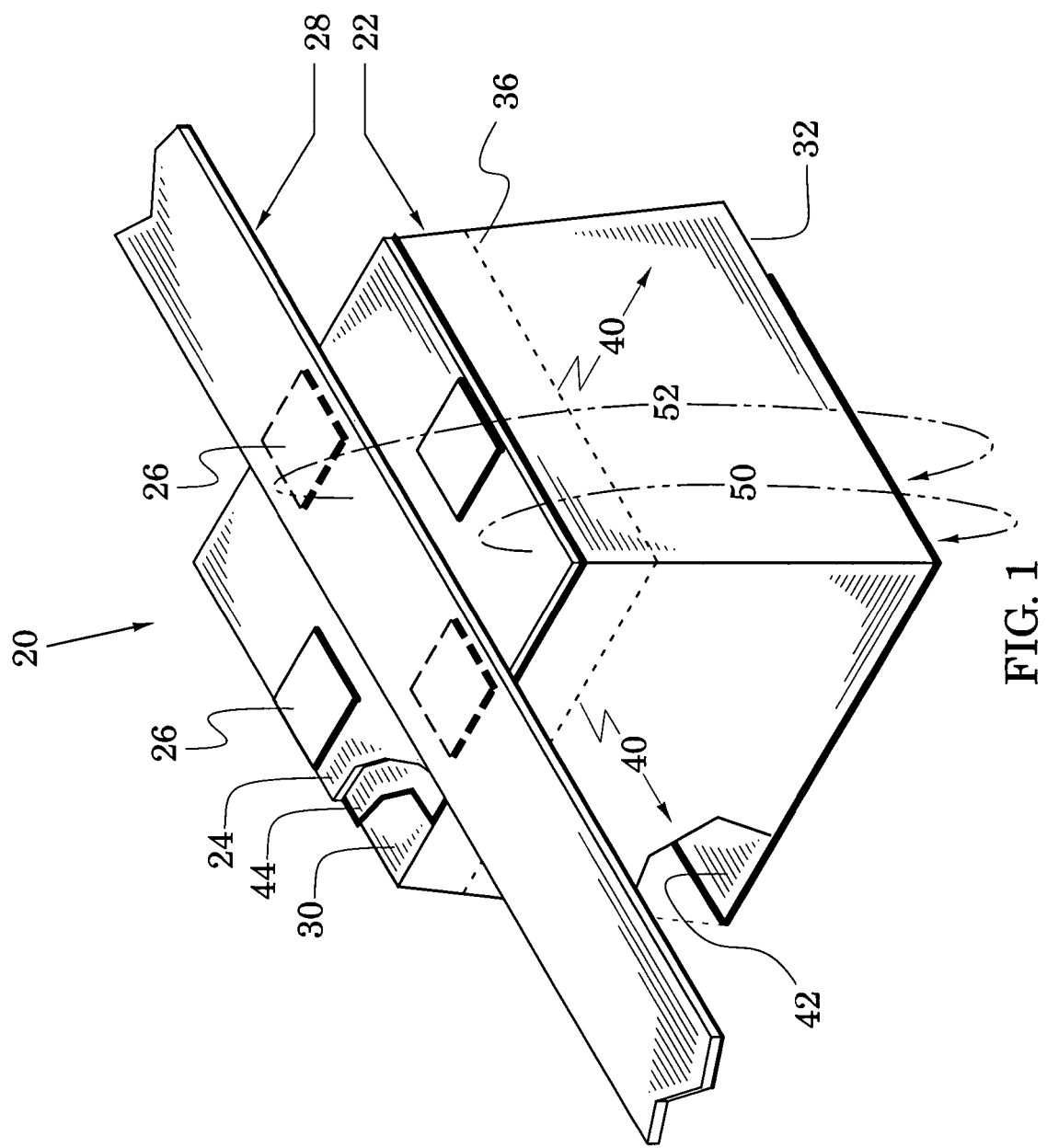
FIGS. 1-4 are isometric views of light-emitting structure embodiments of the present invention.

In particular, FIG. 1 illustrates a light-emitting structure 20 that includes a light-emitting diode (LED) die 22, a resistive member 24, contacts 26 and an interconnect member 28. The LED 22 has an anode surface 30 and a cathode surface 32 and the resistive member 24 is carried over the anode surface 30.

As evident in FIG. 1, access to the LED is provided by the interconnect member 28 and the cathode surface 32. In response to a voltage across these structures, the anode-cathode junction 36 of the LED 22 emits light 40 whose wavelength is a function of the LED's semiconductor composition.

Semiconductor LEDs have been configured to emit light with a variety of wavelengths and, generally, the forward voltage drop of these LEDs increases as the wavelength decreases. For example, red, yellow and green LEDs typically exhibit forward voltage drops in the respective ranges of 1.8-2.0 volts, 2.0-2.2 volts and 2.2-2.5 volts. In addition, each LED typically has a specified forward current that is recommended to enhance LED performance parameters (e.g., intensity, dissipation and lifetime).

Accordingly, the resistive member 24 may have a resistivity and a cross section that are configured to realize a predetermined resistance which will provide the specified forward current when a selected supply voltage is applied to the light-emitting structure 20. An exemplary green LED, for example, is specified to have a forward voltage drop of 2.8 volts and a forward current of 20 milliamps. For this particular LED, the resistivity and cross section of the resistive member 24 of FIG. 1 would preferably be configured to provide a resistance that increases through the range of 10 to 100 ohms when the selected supply voltage increases through the range of 3.0 to 4.8 volts. In general, the resistivity and cross section of the resistive member 24 may be chosen to realize the specified forward current in response to a provided supply voltage.

As exemplified in FIG. 1, the interconnect member 28 is coupled to the resistive member 24 by selected ones of several conductive contacts 26 (the selected contacts are thus shown in broken lines). Preferably, a similar conductive member 42 is carried over the cathode surface 32 and a similar conductive film 44 is also inserted between the anode surface 30 and the resistive member 24 to enhance conductivity between these elements (it is noted that various structures have been broken away in FIG. 1 to facilitate referencing of different structures, e.g., the resistive film 42 is broken away from one corner of the LED to permit referencing of the cathode surface 32).

In one embodiment, the interconnect member 28 is a conductive wire formed of a suitable conductive metal (e.g., aluminum, copper, tin or alloys thereof). Among other cross sections that may be used, FIG. 1 shows a flat cross section which may facilitate joining (e.g., by soldering) of the interconnect member to the contacts 26. In an exemplary LED arrangement, the interconnect member 28 can extend for some distance and couple to a plurality of light-emitting structures that are similar to the structure 20.

Although FIG. 1 places the resistive member 24 over the anode surface 30, another light-emitting structure embodiment is formed by moving the resistive member to the cathode surface 32 as indicated by movement arrow 50. In this embodiment, the interconnect member 28 remains coupled to the anode surface but, in another embodiment, it can also move as indicated by the movement arrow 52 so that the resistive member 24 is inserted between it and the cathode surface 32. Alternatively, the interconnect member 28 can move to the cathode surface and the resistive member can remain on the anode surface. In yet another embodiment, the resistance of the resistive member 24 can be realized by first and second resistive members that are respectively carried on the anode and cathode surfaces 30 and 32.

In all of these embodiments, a resistive member is carried over a surface of an LED to form light-emitting structures whose size is substantially reduced from that of conventional LED structures (in particular, those that include discrete resistors with connective wire leads). In addition, the structures are compatible with fabrication processes (e.g., thin and thick film processes) that can substantially reduce their costs from those of conventional LED structures. Integration of these light-emitting structures into various light display structures is simplified because of their reduced size and because they eliminate the need for additional current-limiting elements.

Figure 2:
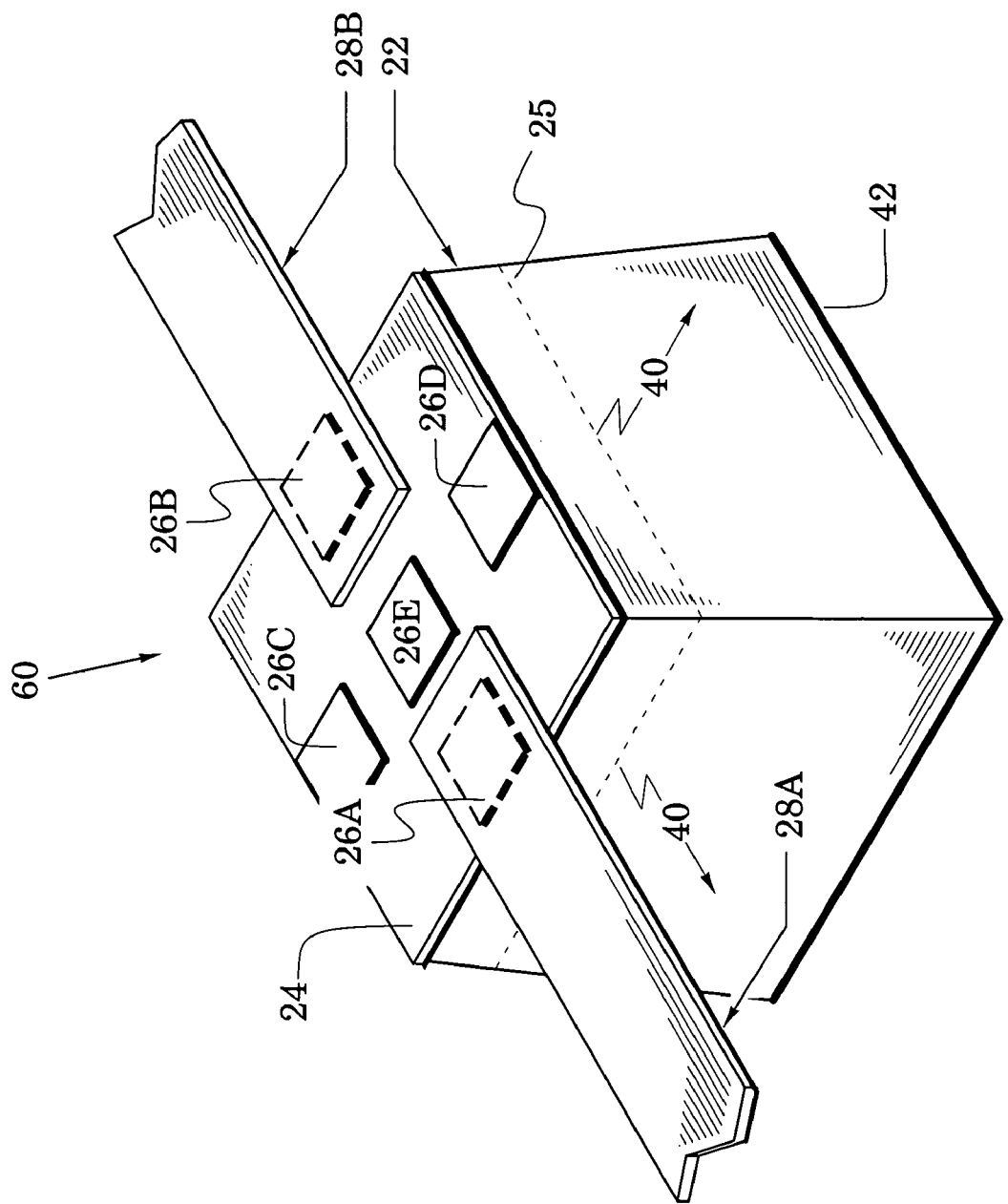

Another embodiment is shown in FIG. 2 as the light-emitting structure 60 which includes elements of FIG. 1 with like elements indicated by like reference numbers. The structure 60 replaces the interconnect member 28 of FIG. 1 with interconnect members 28A and 28B which are respectively coupled to different contacts 26A and 26B.

In this embodiment, the resistive member 24 not only establishes a predetermined current for the LED 22 but also introduces a resistance between the interconnect members 28A and 28B that is a function of the resistivity and cross section of the resistive member 24 and the physical relationship between this element and the contacts 26A and 26B (e.g., the spacing of the contacts 26A and 26B).

The embodiment 60 may find utility in various light applications such as one in which different intensities are desired in a string of LEDs. The resistance between the interconnect members 28A and 28B can be used here and in similar light-emitting structures along the string to vary the current, and thus the intensity, of the LEDs of the string. The spacing of the contacts 26A and 26B facilitates this feature.

In another feature, a second set of contacts 26C and 26D is provided so that the orientation of the LED 22 in FIGS. 1 and 2 is not critical. This embodiment finds utility in light applications such as one in which LEDs are received into mounting structures. With contacts 28A-28D, each LED can be received in the orientation shown in FIGS. 1 and 2 or in an orientation in which it is rotated 90 degrees. In the latter orientation, the interconnect member 28 could be coupled to contacts 28C and 28D in FIG. 1 and the interconnect members 28A and 28B could be respectively coupled to contacts 28C and 28D in FIG. 2. In applications that do not need this orientation feature, the contacts 28A-28D may be replaced by a single centrally-located contact 28E as shown in FIG. 2. If desired, the contact 28E may be larger. It may, for example, expand to cover the resistive member 24.

Figure 3:
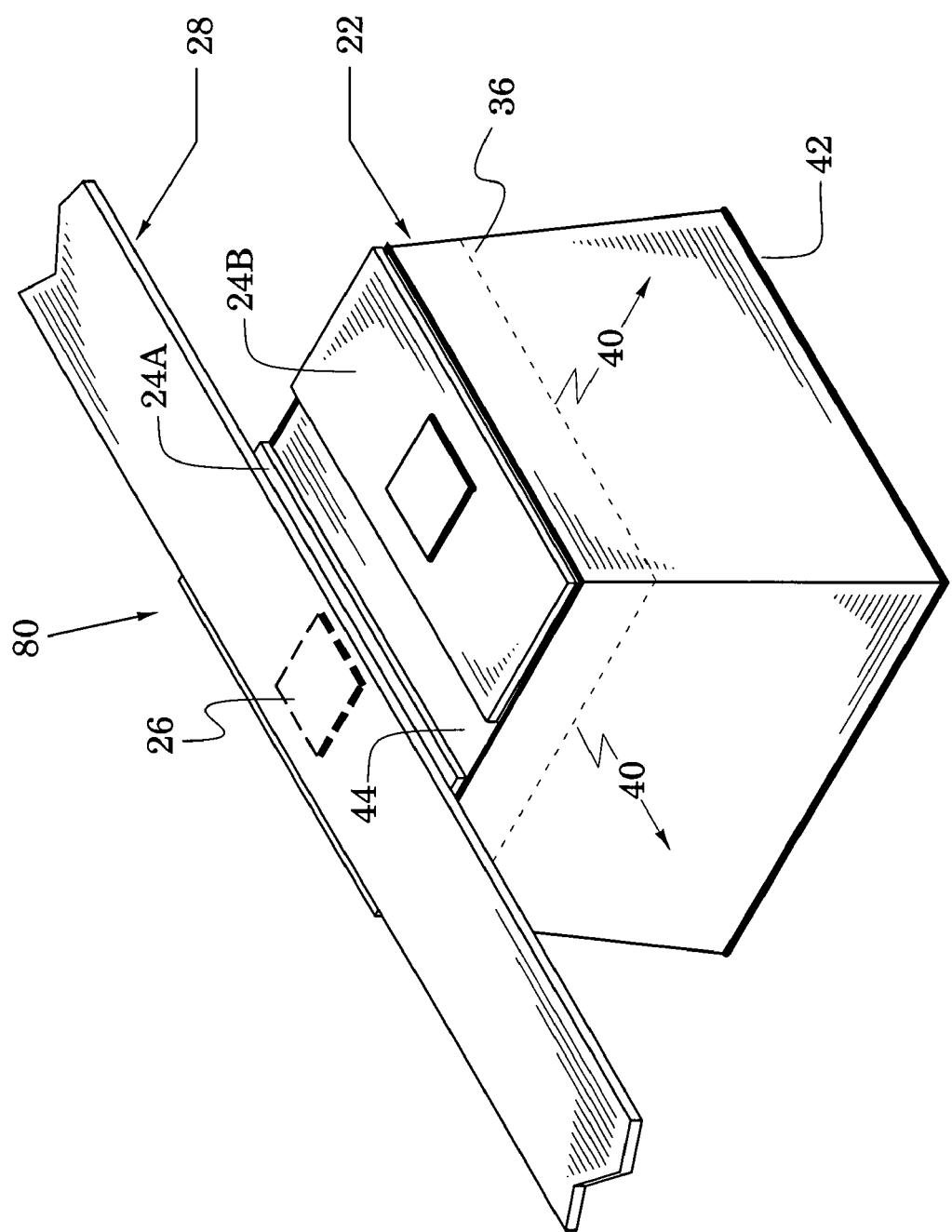

Another embodiment is shown in FIG. 3 as the light-emitting structure 80 which includes elements of FIG. 1 with like elements indicated by like reference numbers. The structure 80 replaces the resistive member 24 of FIG. 1 with two resistive members 24A and 24B that are spaced apart. A contact 26 is carried on each of the resistive members and the interconnect member 28 is carried over the contact that corresponds to a selected one of the resistive members—in particular, the resistive member 24A.

The structure 80 permits standard resistive patterns to be printed on a large number of LEDs without concern to the color of the LEDs. For each of these LEDs, the interconnect member 28 would then be coupled to the resistive pattern that corresponded to the radiated color of that LED. For example, the resistive members 24A and 24B might correspond respectively to red and green LEDs so that their resistivities and cross sections have been chosen to provide resistances appropriate to the voltage drop and specified forward current of these different LEDs.

When a particular one of the structures 80 is formed with a red LED, the interconnect member 28 would be coupled to the resistive member 24A. If the structure is formed instead with a green LED, the interconnect member would be coupled to the resistive member 24B. The embodiment 80 reduces lighting costs because all LEDs can be fabricated with a standard resistive pattern. Alternatively, the resistive members 24A and 24B may both correspond to one LED color (e.g., red) and their different resistivities and cross sections used to selectively adjust the intensity of the radiation of that color.

Although the resistive pattern of FIG. 3 provides two resistive members, other patterns may be substituted that provide a greater number of resistive members. For example, a pattern that defines three resistive members could be used with red, yellow and green LEDs.

Figure 4:
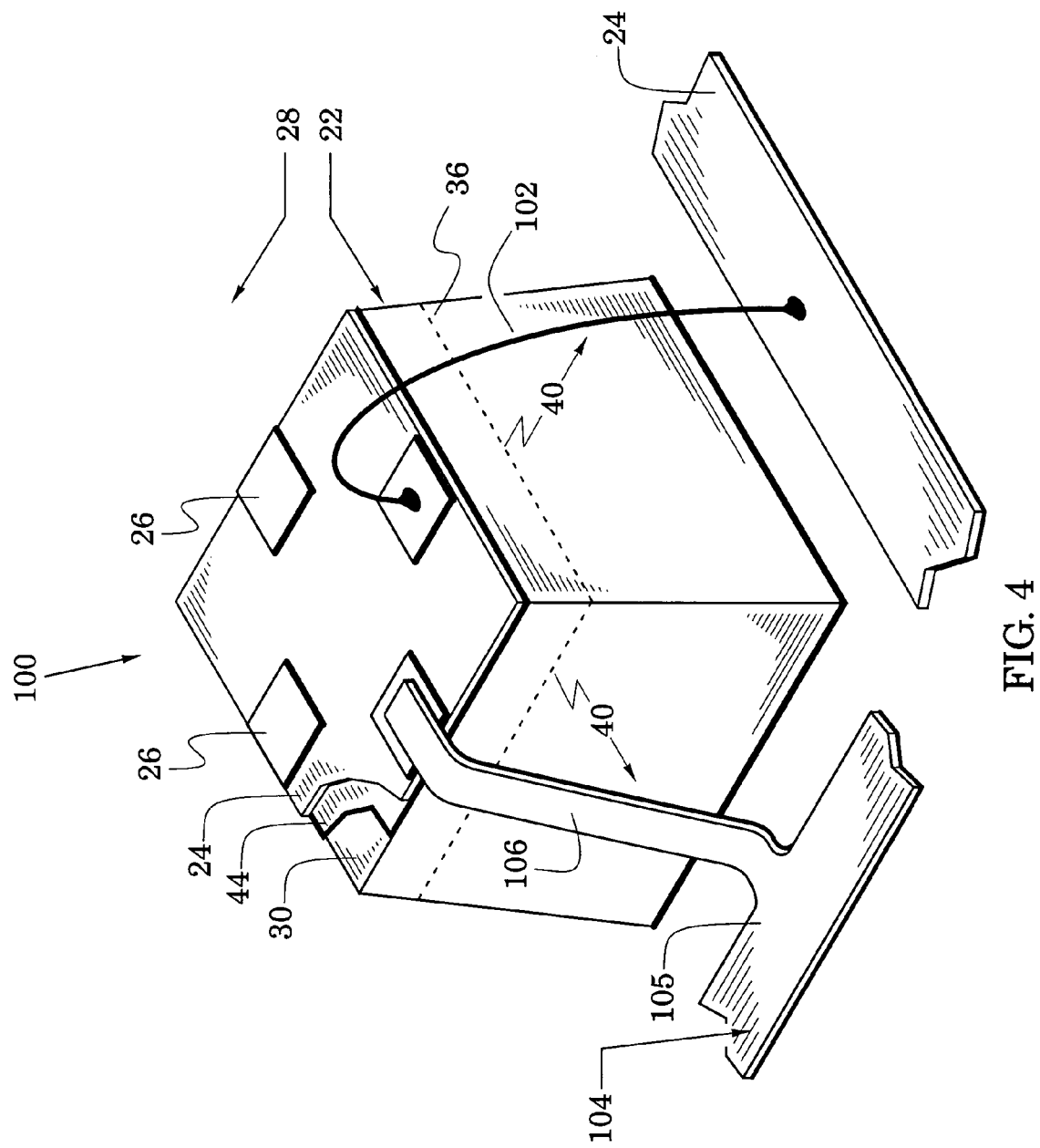

Another embodiment is shown in FIG. 4 as the light-emitting structure 100 which includes elements of FIG. 1 with like elements indicated by like reference numbers. The structure 100 inserts a wire bond 102 to couple the interconnect member 28 to a selected one of the contacts 26. This structure permits the interconnect member to be positioned in a convenient arrangement with the LED (e.g., coplanar with the cathode of the LED).

A different embodiment is also shown in FIG. 4 wherein an interconnect structure 104 includes an interconnect member 105 that defines an interconnect tab 106 which is formed to couple the interconnect member to a selected one of the contacts 26. It is noted that the contacts of FIG. 4 could simply be one centrally-located contact.

Although described with reference to a semiconductor LED (22 in FIG. 1), it is intended that the teachings of the invention be practiced with a wide variety of LEDs that include semiconductor LEDs, organic LEDs (devices in which light issues from a fluorescent organic material), and polymer LEDs (devices in which various light-emitting polymers are used as the semiconductor material).

The resistive members (24 in FIG. 1) may be realized with various structures such as conductive pastes, resistive metals and resistive inks (e.g., formulations of carbon inks and silver inks). In particular, they may be resistive films such as thin film resistors (e.g., sputtered films of resistive metals or metal combinations such as chrome-nickel and nickel-vanadium) or thick film resistors (e.g., stenciled-on pastes of carbon or carbon-metal powders which are cured or sintered). They may also be applied with a variety of conventional processes (e.g., plated, silkscreen, screen printed, transfer printed, blade coated, spin coated or stamped).

The contacts (26 in FIG. 1) and conductive films (42 and 44 in FIG. 1) may be realized with various conductive materials such as silver inks, conductive epoxies (e.g., silver epoxies), metallic films (e.g., gold or aluminum), and solder.

The interconnect members (28 in FIG. 1) may be coupled directly to the resistive members or to the LED anode and cathode surfaces or may be coupled via other connective structures (e.g., wire bonds, and connective tabs) that are formed with various conductive materials (e.g., aluminum and gold) and applied with various processes (e.g., ultrasonic welding).

The term light-emitting diode typically indicates an LED die (22 in FIGS. 1-3) but is also used to indicate a package that combines other structures (e.g., a lens and a packaged resistor) with an LED die. It is noted that the term LED refers herein to an LED die. It is further noted that the structures of FIGS. 1-4 are greatly enlarged. For example, typical LEDs have dimensions (e.g., height and sides of anode and cathode surfaces) on the order of 100 to 400 micrometers.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A light-emitting structure, comprising:
   a plurality of light-emitting diodes each having an anode and a cathode and each configured to emit a respective color of light;
   a plurality of resistive members spaced over at least one of said anode and said cathode of each of said diodes wherein each of said resistive members has a different resistance;
   at least one conductive contact carried on each of said resistive members; and
   a conductive wire coupled through a contact to a respective one of the resistive members of each of said diodes to thereby form an interconnected string of diodes that will each carry a respective current when a voltage is applied to said wire.

2. The structure of claim 1, further including a conductive film inserted between each of said resistive members and its respective diode.

3. The structure of claim 1, wherein each of said resistive members has a resistivity and a cross section configured to realize its respective resistance.

4. The structure of claim 1, wherein said wire has a substantially flat cross section.

5. The structure of claim 1, wherein each resistive member comprises a resistive film.

6. The structure of claim 1, wherein each resistive member comprises a thin film resistor.

7. The structure of claim 1, wherein each resistive member comprises a thick film resistor.

8. The structure of claim 1, wherein said light-emitting diode is a semiconductor light-emitting diode.

9. The structure of claim 1, wherein said light-emitting diode is an organic light-emitting diode.

10. The structure of claim 1, wherein said light-emitting diode is a polymer light-emitting diode.

* * * * *